US 12,023,756 B2

(12) United States Patent
Fettke et al.

(10) Patent No.: US 12,023,756 B2
(45) Date of Patent: Jul. 2, 2024

(54) METHOD FOR REMOVING ELECTRONIC COMPONENTS CONNECTED TO A CIRCUIT BOARD

(71) Applicant: Pac Tech—Packaging Technologies GmbH, Nauen (DE)

(72) Inventors: Matthias Fettke, Berlin (DE); Andrej Kolbasow, Paulinenaue (DE)

(73) Assignee: Pac Tech—Packaging Technologies GmbH, Nauen (DE)

( * ) Notice: Subject to any disclaimer, the term of this patent is extended or adjusted under 35 U.S.C. 154(b) by 345 days.

(21) Appl. No.: 17/164,159

(22) Filed: Feb. 1, 2021

(65) Prior Publication Data

US 2022/0126398 A1  Apr. 28, 2022

(30) Foreign Application Priority Data

Oct. 23, 2020  (LU) ........................................ 102151

(51) Int. Cl.
*B23K 26/12* (2014.01)
*B23K 26/03* (2006.01)
(Continued)

(52) U.S. Cl.
CPC ........ *B23K 26/1224* (2015.10); *B23K 26/034* (2013.01); *B23K 26/38* (2013.01); *H01L 25/0753* (2013.01); *H05K 3/303* (2013.01)

(58) Field of Classification Search
CPC ................ B23K 1/0056; B23K 20/004; B23K 2101/32; B23K 2101/42; B23K 26/009;
(Continued)

(56) References Cited

U.S. PATENT DOCUMENTS 3,834,605 A  9/1974  Coffin ...................... B23K 1/00
228/20
3,879,836 A  4/1975  Coffin ...................... B23P 19/02
29/427
(Continued)

FOREIGN PATENT DOCUMENTS

CN  102861959 A  1/2013
CN  106031328 A  10/2016
(Continued)

OTHER PUBLICATIONS

Nagayasu, JP 2005007428 A (Year: 2005).*
(Continued)

*Primary Examiner* — Vy T Nguyen
(74) *Attorney, Agent, or Firm* — Imperium Patent Works; Darien K. Wallace

(57) ABSTRACT

A device for removing a defective electronic component from a circuit board includes a vacuum suction nozzle, a laser beam emitter and an infrared temperature sensor. The vacuum suction nozzle has a suction opening at which suction is generated. The suction opening is dimensioned to be larger than the defective electronic component. The laser beam emitter is oriented so as to emit a laser beam out the suction opening towards the electronic component on the circuit board. The temperature sensor measures the temperature of the electronic component based on infrared radiation emitted from around the electronic component. A method for removing the defective electronic component from the circuit board includes positioning the suction opening over the electronic component and directing the laser beam through the suction opening and onto the electronic component so as to heat and detach the electronic component, which is then sucked into the vacuum suction nozzle.

17 Claims, 5 Drawing Sheets

(51) Int. Cl.
  *B23K 26/38* (2014.01)
  *H01L 25/075* (2006.01)
  *H05K 3/30* (2006.01)
(58) Field of Classification Search
  CPC . B23K 26/0884; B23K 3/087; H01L 2224/78; H05K 2201/10287; H05K 2203/107; H05K 3/3421; H05K 3/3489; H05K 3/3494
  See application file for complete search history.

(56) References Cited

U.S. PATENT DOCUMENTS

| | | | | |
|---|---|---|---|---|
| 5,122,635 | A * | 6/1992 | Knodler | H05K 13/0465 219/121.78 |
| 5,148,969 | A | 9/1992 | Boucher et al. | B23K 1/00 228/264 |
| 5,864,944 | A | 2/1999 | Kashiwagi et al. | H05K 3/30 29/833 |
| 2002/0046461 | A1 | 4/2002 | Oe | B23P 19/00 29/743 |
| 2014/0001162 | A1* | 1/2014 | Tanaka | H01L 24/75 219/121.6 |
| 2014/0224773 | A1* | 8/2014 | Murata | B23K 3/0623 219/85.13 |
| 2017/0352640 | A1* | 12/2017 | Park | B23K 26/38 |
| 2022/0126398 | A1 | 4/2022 | Fettke et al. | B63K 26/12 |
| 2022/0132714 | A1 | 4/2022 | Fettke et al. | H05K 13/04 13/486 |

FOREIGN PATENT DOCUMENTS

| | | | |
|---|---|---|---|
| CN | 111556705 | A | 8/2020 |
| CN | 114501977 | A | 5/2022 |
| CN | 114501978 | A | 5/2022 |
| DE | 102018002714 | A1 * | 10/2018 |
| JP | 60-53034 | | 3/1985 |
| JP | 5-235535 | | 2/1992 |
| JP | 5-235535 | A | 9/1993 |
| JP | 05-235535 | A | 9/1993 |
| JP | H05-235535 | A | 9/1993 |
| JP | H07-297539 | A | 11/1995 |
| JP | 2002-501439 | | 6/1998 |
| JP | 2002-501439 | A | 1/2002 |
| JP | 2005-007428 | A | 1/2005 |
| JP | 2006-237522 | | 9/2006 |
| JP | 2006-294958 | A | 10/2006 |
| JP | 2009-164310 | A | 12/2007 |
| JP | 2009-164310 | A | 7/2009 |
| JP | 10-2019-0062089 | | 6/2019 |
| JP | 2020-129658 | A | 2/2020 |
| JP | 2020-129658 | A | 8/2020 |
| JP | 2022-69368 | | 5/2022 |
| KR | 10-1890934 | B1 | 8/2018 |
| KR | 10-2019-0062089 | | 6/2019 |
| WO | WO2016/103800 | A1 | 9/2015 |
| WO | WO2016/103800 | A1 | 6/2016 |

OTHER PUBLICATIONS

JPH06226478 (Year: 1994).*
Decision of Grant (issue notification) of the Japanese Patent Office in the. Related Japanese patent application JP2021-000715 dated Nov. 1, 2022 with list of references A-I considered by the examiner, including English translation (4 pages).
Office action of the Japanese Patent Office in the related Japanese patent application JP2021-172072 dated Oct. 26, 2022 citing references A-F, as well as the English translation of the Japanese Office action (11 pages).
Office action of the Korean Patent Office dated Jun. 20, 2022, in the related Korean patent application KR10-2021-0002469 citing references A-C (12 pages).
Office action of the Japanese Patent Office in the related Japanese patent application JP2021-000715 dated Dec. 15, 2021 citing references A-C, as well as the English translation of the Japanese Office action (8 pages).
Decision of Grant of the Japanese Patent Office in the related Japanese patent application JP2021-172072 dated Apr. 25, 2023 citing references B-H (3 pages).
Office action of the Chinese Patent Office in the related Chinese patent application CN 202110106068.8 dated Apr. 29, 2023 citing references C-I, as well as the English machine translation of the Chinese Office action (21 pages).
Office action of the Chinese Patent Office in the related Chinese patent application CN 202111235064.6 dated Apr. 29, 2023 citing references H-K, as well as the English translation of the Chinese Office action (40 pages).
Office action of the Japanese Patent Office in the related Japanese patent application JP2021-000715 dated Aug. 2, 2022 citing references A-D, as well as the English translation of the Japanese Office action (6 pages).
Office action of the Chinese Patent Office in the related Chinese patent application CN 202110106068.8 dated Oct. 21, 2023 citing references C-E, as well as the English machine translation of the Chinese Office action (23 pages).
Notice of Allowance dated Jan. 13, 2024 from the Chinese Patent Office in the related Chinese patent application CN 202111235064.6 citing references A-B (5 pages).
Office action dated Mar. 30, 2024 of the Chinese Patent Office in the related Chinese patent application CN 202110106068.8 citing references A-C, as well as the English machine translation of the Chinese Office action (15 pages).

* cited by examiner

METHOD FOR REMOVING ELECTRONIC COMPONENTS CONNECTED TO A CIRCUIT BOARD

CROSS REFERENCE TO RELATED APPLICATION

This application is based on and hereby claims the benefit under 35 U.S.C. § 119 from Luxembourg Patent Application No. LU102151, filed on Oct. 23, 2020, in the Luxembourg Intellectual Property Office. This application is a continuation-in-part of Luxembourg Patent Application No. LU102151, the contents of which are incorporated herein by reference.

TECHNICAL FIELD

The invention relates to a method and an apparatus for removing electronic components from a circuit board.

BACKGROUND

In the field of display technology with multiple mini or μLEDs arranged in a matrix on a planar circuit board, it is often necessary to replace or remove defect LEDs. This is usually done by heating the defect LED and then mechanically removing it with a gripping tool. The heating is achieved using hot nitrogen or by contact heating.

The patent document KR 101890934 B1 discloses a method for removing defect μLEDs using a laser beam for heating the defect LED and then removing it with a gripping tool, such as a vacuum pipette. A disadvantage of such a system is that the heating laser has to be positioned in the x-y plane, while the gripping tool has to be positioned in x-y-z space. This leads to a reduced processing speed.

Accordingly, it is an object of the present invention to provide a method and an apparatus for removing electronic components from a board that permits increased processing speed and that uses simple tool-designs.

SUMMARY

A device for removing a defective electronic component from a contact area on a printed circuit board includes a vacuum suction nozzle, a laser beam emitter and an infrared temperature sensor. The vacuum suction nozzle has a suction opening at which suction is generated. The suction opening is dimensioned so as to be larger than the electronic component. The laser beam emitter is oriented so as to emit a laser beam through the vacuum suction nozzle and out the suction opening towards the contact area on the circuit board. The temperature sensor is adapted to measure the temperature around the contact area based on infrared radiation emitted from around the contact area. A control and drive means turns off the laser beam emitter when the temperature sensor senses a sudden and significant increase in temperature or when the temperature exceeds a predetermined threshold. The control and drive means also positions the suction opening over the defective electronic component and controls how process gas is directed towards the contact area. In one embodiment, the defective electronic component is a micro light-emitting diode (μLED) of a matrix of LEDs that are mounted on the circuit board.

In one embodiment, a beam splitter is positioned in the path of the laser beam and reflects the infrared radiation that is emitted from the contact area towards the temperature sensor. In another embodiment, infrared radiation is guided from the contact area to the temperature sensor through a monofilament fiber guide.

A method for removing an electronic component from a circuit board includes positioning a suction opening of a vacuum suction nozzle over the electronic component that is to be removed. The electronic component is mounted at a contact area onto the circuit board using solder. A laser beam is directed through the suction opening and onto the electronic component. The electronic component is heated using the laser beam so as to melt the solder and detach the electronic component. The temperature around the contact area is measured based on infrared radiation emitted from around the contact area. In one embodiment, the temperature is measured based on infrared radiation emitted from around the contact area that travels through the vacuum suction nozzle and is then reflected by a beam splitter towards a temperature sensor. In another embodiment, the temperature is measured based on infrared radiation that is guided from around the contact area in a fiber guide to the temperature sensor. In yet another embodiment, the temperature is measured based on infrared radiation emitted from around the contact area that is received through optics at the temperature sensor. The laser beam is turned off when the temperature around the contact area makes a sharp increase or exceeds a threshold temperature. The electronic component is then sucked into the vacuum suction nozzle using vacuum suction.

The invention relates to a method and an apparatus for removing electronic components from a circuit board with increased speed and simple design tools. In the field of display technology with multiple mini or micro LEDs arranged in a matrix on a planar circuit board, it is often necessary to replace or remove defective LEDs. This is usually done by heating the defective LED and then mechanically removing it with a gripping tool. The heating is conventionally achieved with hot nitrogen or by contact heating. The novel removal method includes the step of selectively heating the defective electronic component and its contact area on the circuit board using a laser beam. Simultaneously with the heating step, vacuum suction is applied to the electronic component that is to be removed. When the electronic component to be removed is released from the circuit board due to laser heating and vacuum suction, the electronic component is sucked away. This is achieved by applying a vacuum suction nozzle for removing the defective electronic component and a laser beam emitter guiding the heating laser beam through the vacuum suction nozzle onto the defective component. Both the heating with the laser beam and the removal with the vacuum nozzle require positioning only in an x-y plane, i.e., no movement is necessary in the z plane. Thereby the processing speed is increased.

Other embodiments and advantages are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
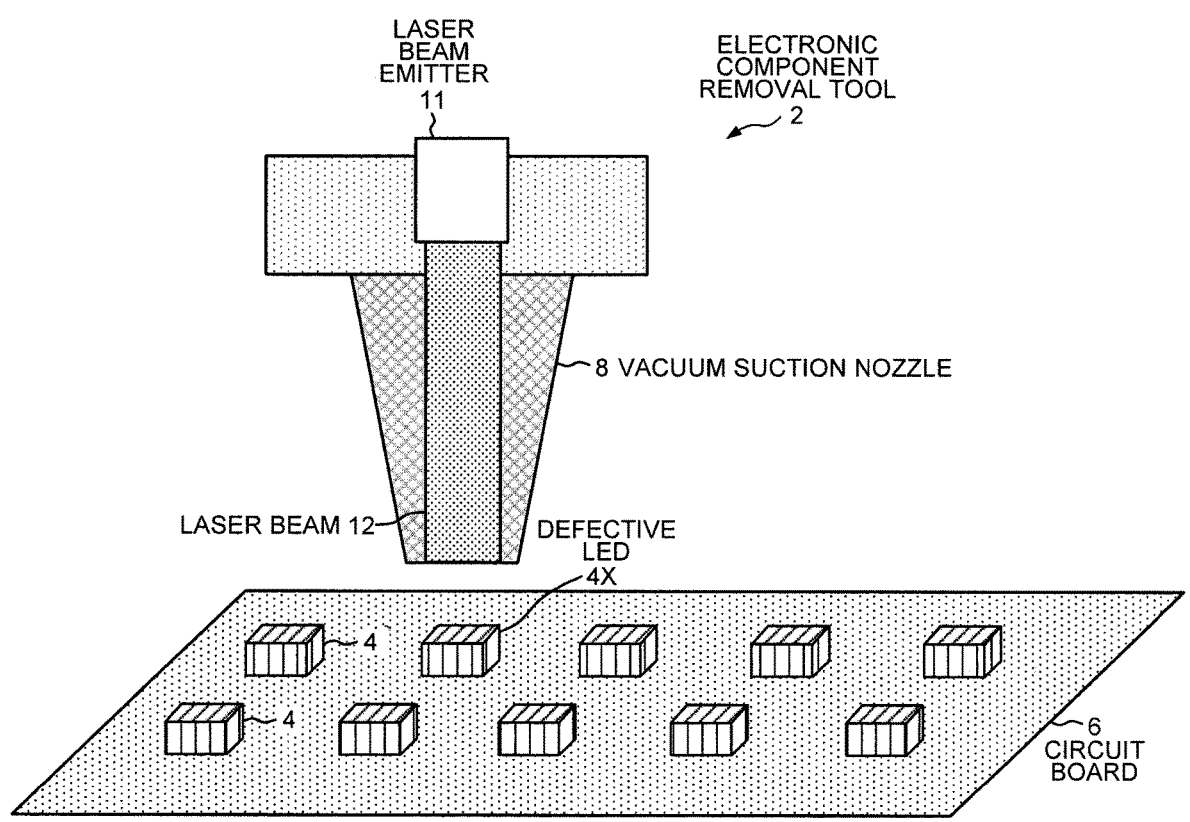
FIG. 1 is a schematic illustration showing a matrix of μLEDs, including defective μLEDs, and the novel removal tool in accordance with a first embodiment.

FIG. 1 shows a novel electronic component removal tool 2 positioned above a defective electronic component 4X that is to be removed from a circuit board 6. The novel removal tool 2 includes a vacuum suction nozzle 8 with a suction opening 10 and a laser beam emitter 11 used to direct a heating laser beam 12 through the center of the vacuum suction nozzle 8 and through the suction opening 10 onto the electronic component 4X that is to be removed. The heat from the laser beam 12 releases the electronic component 4X from the circuit board 6. The released electronic component 4X is sucked into the vacuum suction nozzle 8 and thereby removed from the circuit board 6.

The novel removal method includes the step of selectively heating the defective electronic component 4X and its contact area 5 on the circuit board 6 using a laser beam 12. Simultaneously with the heating step, the electronic component 4X is removed by applying vacuum suction. When the electronic component 4X to be removed is loosened from the circuit board 6 by the laser heating, the electronic component 4X is sucked away using vacuum suction. This is achieved using a vacuum suction nozzle 8 for removing the defective electronic component 4X and a laser beam emitter 11 that guides a heating laser beam 12 through the vacuum suction nozzle 8 onto the defective component 4X.

Both the heating with the laser beam 12 and the removal with the vacuum nozzle 8 require positioning only in the x-y plane, i.e., no movement in the z plane is necessary. The processing speed for removing defective components is thereby increased.

By directing the laser beam 12 through the vacuum suction nozzle 8, the positioning of the vacuum suction nozzle simultaneously positions the laser beam 12 over the correct location.

As an alternative, the laser beam 12 is mounted to the outside of the vacuum nozzle 8 so as to direct the laser beam 12 from the side to the location of the defective component under the suction opening 10 of the vacuum nozzle 8. Again, only one apparatus has to be positioned in the x-y plane.

In contrast to conventional repair processes, the aperture of the novel tool 2 is larger than the outer contour of the defective component 4X so as to allow the passage of the released component into the vacuum channel. The limitations of tool design and manufacturing of handling components in the range of much less than 100 µm by physical contact are no longer a constraint, which is an advancement of the novel removal process with regard to the processing of smallest pitches.

During the heating step, the temperature of the defective electronic component 4X and the temperature at its location 5 are measured in order to control the temperature with the laser beam 12 during the heating step. Excess heat and excessive temperature at the location of the defective component are thereby avoided, and damaging burning of the circuit board 6 at the location of the defective component 4X is prevented.

In one embodiment, the heating is stopped when there is a sharp increase in the measured temperature. This significant change in the temperature indicates that the defective component 4X has been detached from the circuit board 6 by vacuum suction. Damage to the circuit board 6 is avoided by stopping the continued heating from the laser beam 12 as soon as a sudden increase in temperature is measured on the circuit board 6. Alternatively, the heating is stopped as soon as the solder that mounts the defective component 4X to the circuit board 6 has melted, which releases the component into the vacuum suction. The heating is stopped by turning off the laser beam 12. The laser beam can be turned off when there is a sudden and significant increase in the measured temperature or when the measured temperature exceeds a threshold.

The temperature is measured by an infrared (IR) sensor 16 with appropriate optics 18 without contacting the heated location. The IR sensor 16 can be positioned either outside of the laser interaction zone or can be within the optical laser path by using a beam splitter 25.

Alternatively, the temperature sensor 16 is provided with a light guide fiber 20 with its free end being positioned in the vicinity of the heated location. This is another way in which the temperature at the heated location can be measured.

In another embodiment, process gas 24 is passively or actively applied to the heated location in order to avoid oxidation of the solder and/or to assist the detaching process of the defective component 4X from the circuit board 6.

Figure 2:
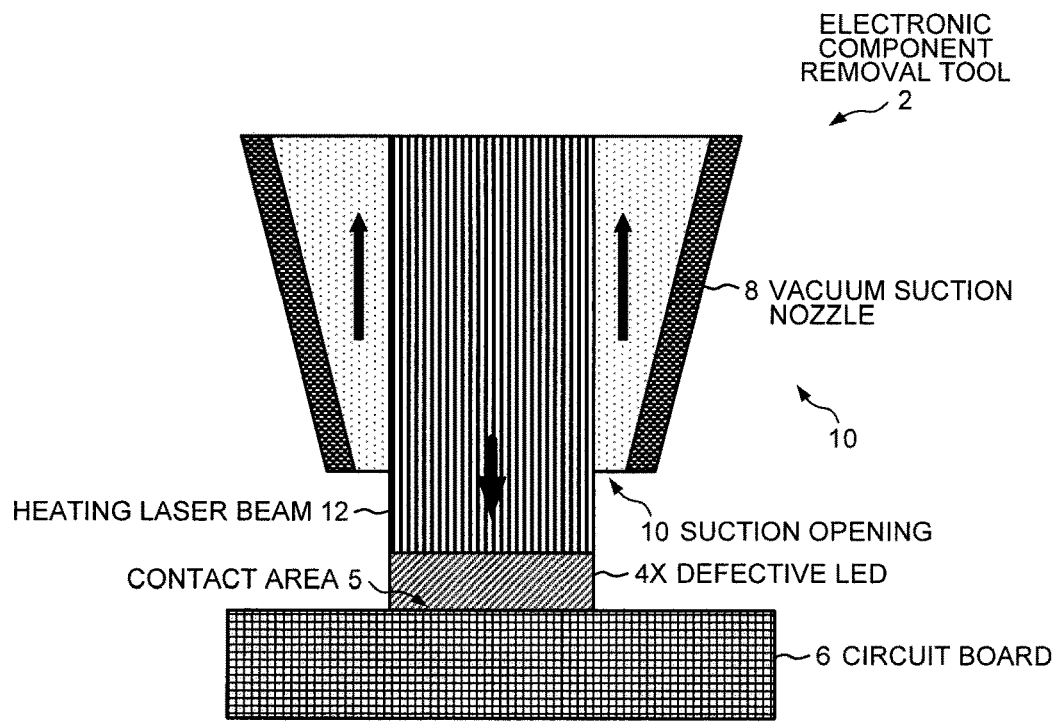
FIG. 2 is a cross-sectional view of the first embodiment with a laser beam directed through a vacuum suction nozzle.

FIGS. 1 and 2 illustrate a first embodiment of the method for removing defective electronic components from a printed circuit board 6. FIG. 2 is a cross-sectional view of the first embodiment. An electronic component removal tool 2 is positioned above a defective micro light-emitting diode (µLED) 4X that is to be removed. The defective µLED 4X and the plurality of other µLEDs 4 are positioned on contact areas 5 on a circuit board 6 in a matrix arrangement as shown in FIG. 1. The LEDs 4 and 4X are mounted to the circuit board 6 for example using solder. In one embodiment, the LEDs 4 are mounted onto contact pads on the printed circuit board 6.

The novel removal tool 2 includes a vacuum suction nozzle 8 with a suction opening 10. In the novel method, the suction opening 10 is positioned over the µLED 4X that is to be removed. The removal tool 2 also includes a laser beam emitter 11 used to direct a heating laser beam 12 through the center of the vacuum suction nozzle 8 and through the suction opening 10 onto the µLED 4X to be removed. The heat from the laser beam 12 releases the µLED 4X from the circuit board 6. The released µLED 4X is sucked into the vacuum suction nozzle 8 and is thereby removed from the circuit board 6.

Figure 7:
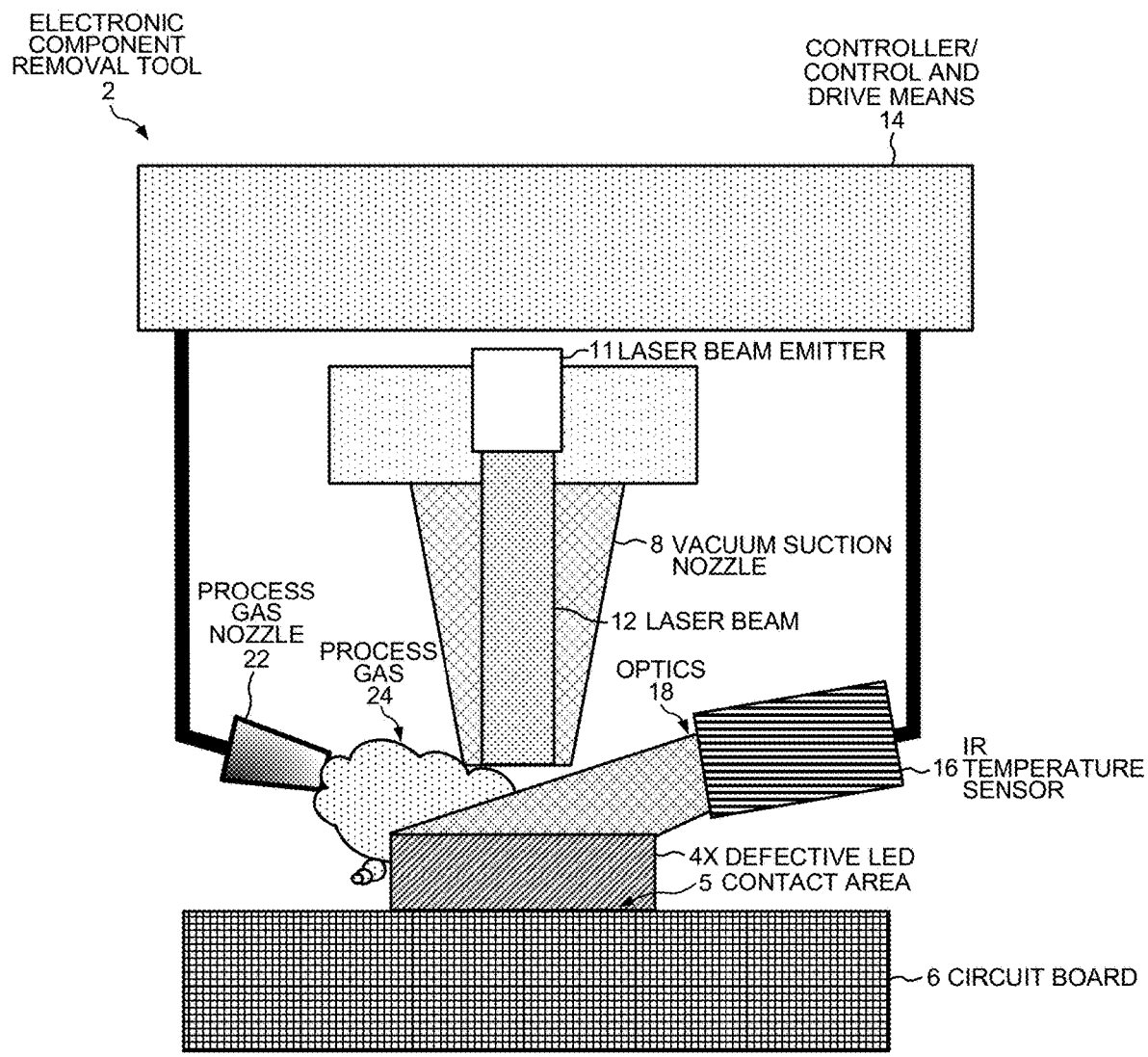
FIG. 7 is a schematic diagram illustrating the interconnection of the various components of the third, fourth and fifth embodiments.

As shown in FIG. 7, a control and drive means 14 controls the positioning of the removal tool 2 with its vacuum suction and controls the laser beam emitter 11. Because the laser beam 12 is small in diameter and because it can be focused, it is possible to heat up only the defective µLED 4X and its contact area 5. By focusing heat only on the defective µLED 4X, damage to neighboring µLEDs 4 by burning is avoided. During the removal process, the removal tool 2 is positioned in the x-y plane only; no movement in the z direction is necessary. By eliminating the need to move the removal tool 2 in the z dimension, the speed of removing defective components is increased.

Figure 3:
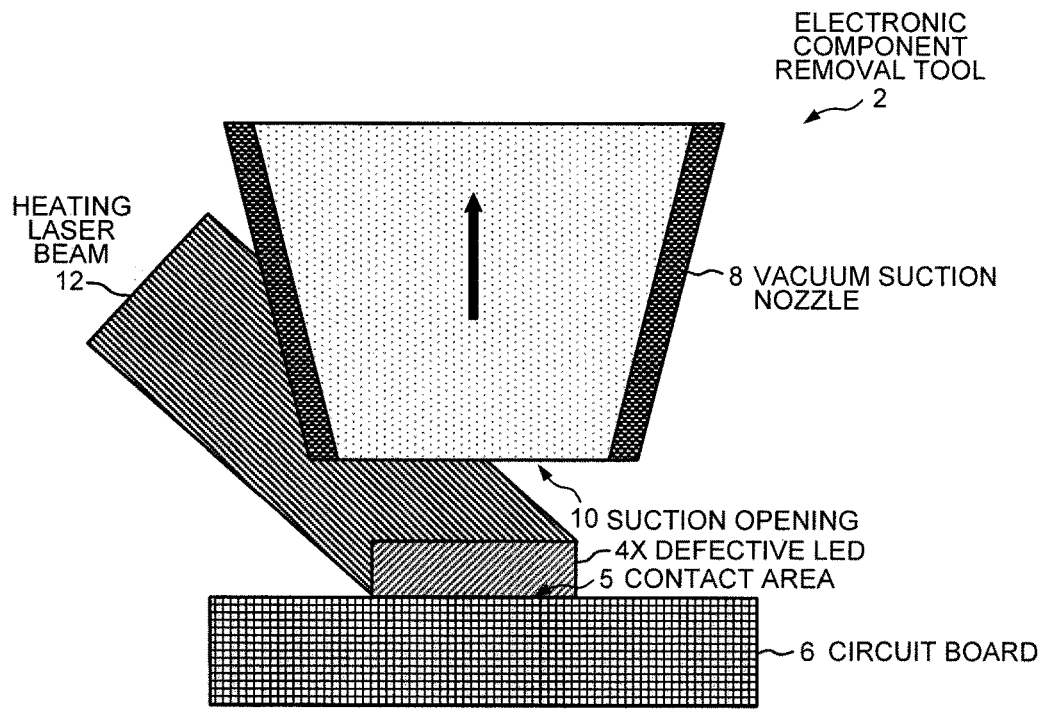
FIG. 3 is a cross-sectional view of a second embodiment with the laser beam being directed from the side to a spot under the suction nozzle opening.

FIG. 3 is a cross-sectional view of a second embodiment similar to the first embodiment of FIG. 2. In the second embodiment of FIG. 3, however, the laser beam 12 is guided from outside the vacuum suction nozzle 8 to an area below the suction opening 10. This is achieved by rigidly mounting the laser beam emitter 11 to the outside of the removal tool 2 such that the laser beam 12 is directed to the area below the suction opening 10. Positioning of the vacuum suction nozzle 8 thereby simultaneously positions the laser beam 12 on the defective µLED 4X that is to be removed. All other features of the second embodiment are the same as those of the first embodiment.

Figure 4:
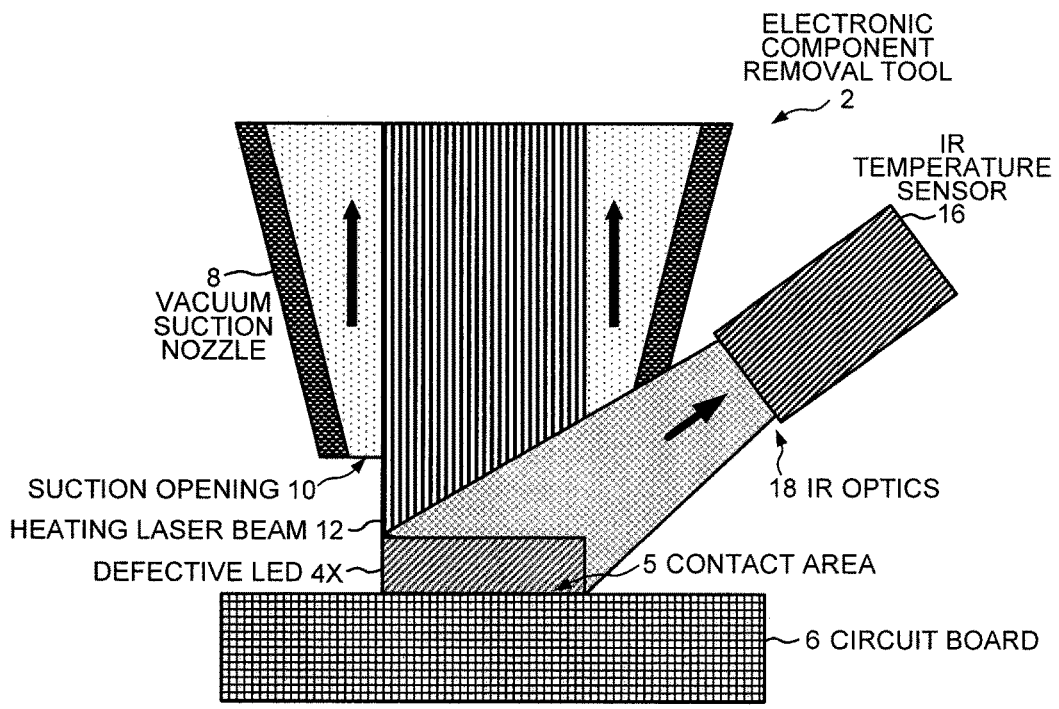
FIG. 4 is a schematic diagram showing a third embodiment with an infrared temperature sensor with optics directed to the heated location.

FIG. 4 is a diagram illustrating a third embodiment. In addition to the features of the first embodiment, an IR temperature sensor 16 is added to the third embodiment. The IR temperature sensor 16 includes IR optics 18 for contactless measurement of the temperature of the defective µLED 4X and its vicinity. The IR optics 18 include a lens that focuses the infrared radiation emitted from the heated object onto a detector, such as a thermopile, which outputs a voltage that is proportional to the incident infrared energy and also the temperature of the heated object. By measuring the temperature of the defective µLED 4X during the heating step of the novel method and correspondingly controlling the heat energy emitted by the laser beam emitter 11, the temperature during the removal process can be controlled by the control and drive means 14. For example, the laser beam 12 is turned off when the measured temperature around the contact area 5 exceeds a threshold temperature at which the solder that attached the µLED 4X to the circuit board 6 has melted.

Figure 5:
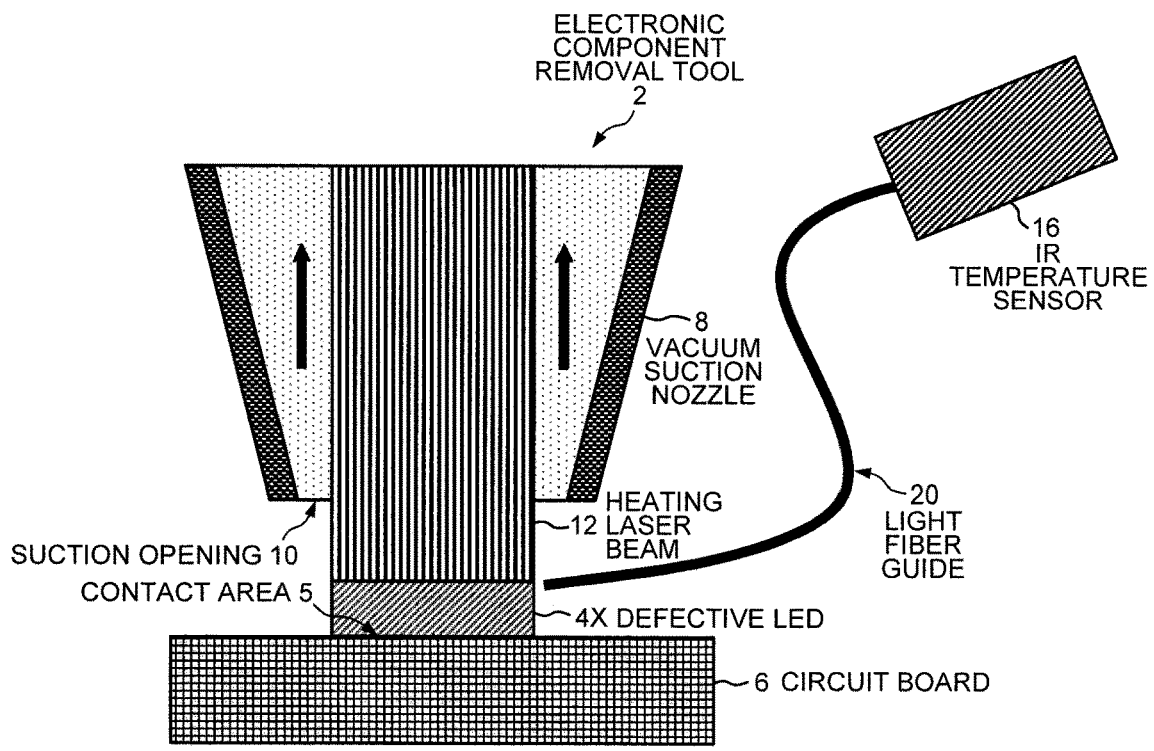
FIG. 5 is a schematic diagram showing a fourth embodiment with an infrared temperature sensor provided with a light guide fiber with its free end positioned in the vicinity of the heated location.

In the fourth embodiment of FIG. 5, a monofilament light fiber guide 20 is connected to the IR temperature sensor 16 instead of using the IR optics 18 of the third embodiment. The free end of the light fiber guide 20 is positioned close to the heated defective µLED 4X and guides the IR emissions from the µLED 4X to the sensor 16 to be used to determine the temperature of the µLED 4X.

It has been found that temperature measured by the IR temperature sensor 16 significantly changes when the defective µLED 4X with its associated liquid solder is released from the circuit board 6. This sharp change of temperature is used as an indication to stop the heating process, i.e., to stop emitting the laser beam 12 within milliseconds of the sharp rise in temperature. The subsequent burning of the circuit board 6 and non-defective µLEDs 4 is thereby avoided.

The temperature is preferably measured by an IR sensor 16 with appropriate optics 18 without contacting the heated contact area 5 or the defective µLED 4X that is to be removed. The IR sensor 16 is positioned outside of the removal tool 2, and the IR radiation is either guided outside of the removal tool 2 to the IR sensor as shown in FIGS. 4 and 5 or is guided from the inside of the vacuum suction nozzle 8 and out with the laser beam 12 using a beam splitting unit 25 as shown in FIG. 6.

Figure 6:
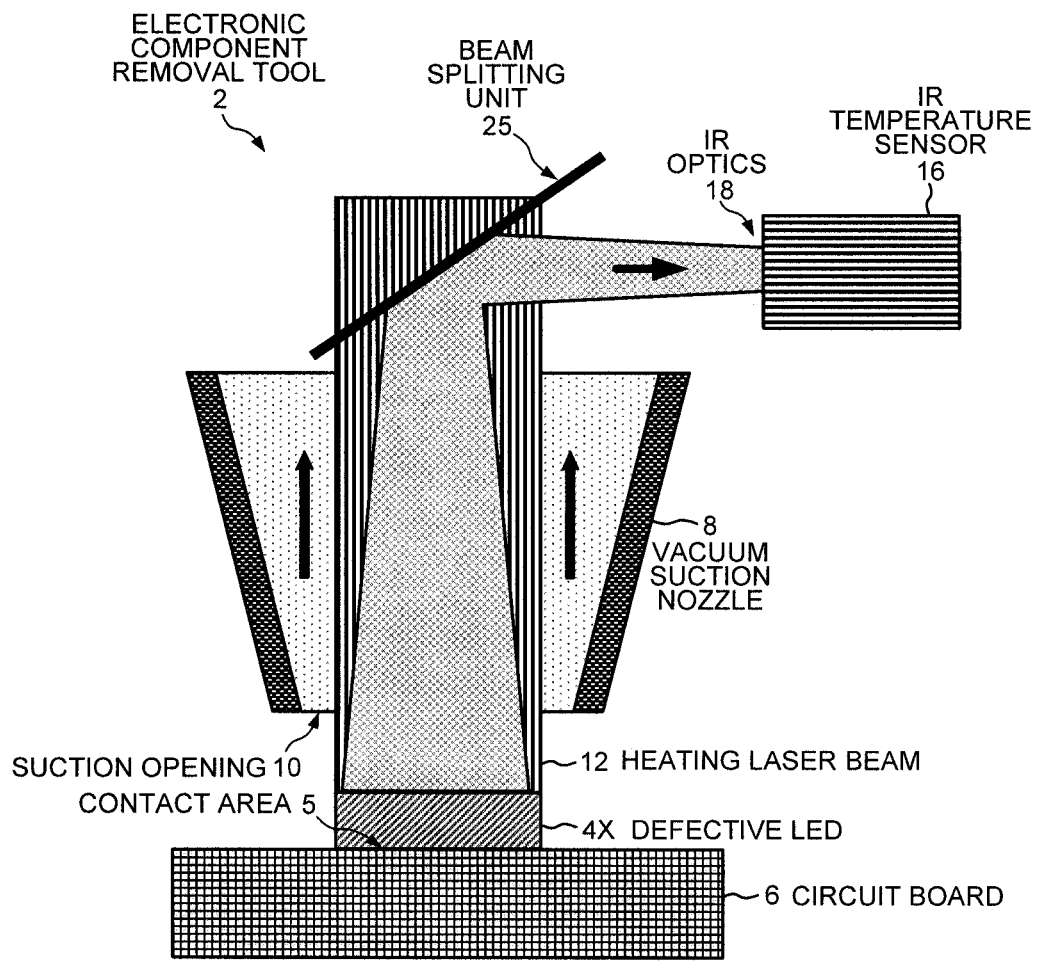
FIG. 6 is a schematic diagram showing the fourth embodiment with an infrared temperature sensor coupled in the laser path by a beam splitting unit.

FIG. 6 is a diagram illustrating a fourth embodiment with an IR temperature sensor 16 coupled in the path of the laser beam 12 by the beam splitting unit 25. The configuration of the fourth embodiment renders the paths of the IR radiation and the laser beam 12 partly collinear instead of using optics 18 to receive the IR radiation from the defective µLED 4X below the suction opening 10 outside the vacuum suction nozzle 8. The beam splitter unit 25 filters the IR radiation from the laser beam and reflects the IR radiation to the IR temperature sensor 16 with an appropriate optics 18.

FIG. 7 shows a diagram illustrating the interconnection of the various components in the third, fourth and fifth embodiments. In addition, FIG. 7 shows a process gas nozzle 22 used to direct process gas 24 towards the heated defective µLED 4X that is to be removed. The process gas helps to avoid oxidation of the liquefied solder during the heating step and it may support the heating dynamics during the heating step. Application of process gas is likewise controlled by the control and drive means 14. The process gas 24 may be nitrogen, argon, helium or formid-gas.

The µLEDs 4 and 4X are usually soldered to the circuit board 6. Likewise, adhesives may be used to mount the µLEDs 4 and 4X or other electronic components to the circuit board 6.

The various embodiments may be combined. The different temperature measurement arrangements may be combined with the different ways of guiding the laser beam 12 to the defective µLEDs 4X that are to be removed. Likewise, the application of process gas 24 may combined with the aforementioned combinations.

LIST OF REFERENCE NUMBERS 2 removal tool
4 µLED
4X defective µLED to be removed
5 contact areas
6 circuit board
8 vacuum suction nozzle
10 suction opening
11 laser beam emitter
12 laser beam
14 control and drive means
16 IR temperature sensor
18 IR optics
20 monofilament light fiber guide
22 process gas nozzle
24 process gas
25 beam splitter Although the present invention has been described in connection with certain specific embodiments for instructional purposes, the present invention is not limited thereto. Accordingly, various modifications, adaptations, and combinations of various features of the described embodiments can be practiced without departing from the scope of the invention as set forth in the claims.

What is claimed is:

1. A system for removing an electronic component from a contact area on a circuit board, comprising:
    the electronic component, wherein the electronic component has a largest dimension;
    a vacuum suction nozzle with a suction opening, wherein a vacuum suction is generated at the suction opening, wherein the suction opening is dimensioned so as to be large enough to allow the electronic component at its largest dimension to pass through the suction opening;
    a laser beam emitter oriented so as to emit a laser beam through the vacuum suction nozzle and out the suction opening towards the contact area on the circuit board;

a temperature sensor adapted to measure a temperature around the contact area based on infrared radiation emitted from around the contact area; and a beam splitter positioned in a path of the laser beam, wherein the beam splitter reflects the infrared radiation that is emitted from the contact area towards the temperature sensor;

wherein the laser beam emitter is controlled to move over the electronic component only in x and y dimensions but not in a z dimension such that the laser beam emitter is heating only the electronic component and the contact area needed to be removed so as avoiding damaging to a neighboring electronic component, and increasing a speed of removing the electronic component.

2. The system of claim 1, wherein the electronic component is a light emitting diode.

3. The system of claim 1, wherein the electronic component is a defective light emitting diode of a matrix of light emitting diodes mounted onto the circuit board.

4. The system of claim 1, wherein the electronic component is soldered to the circuit board.

5. The system of claim 1, wherein the electronic component is attached to the circuit board using an adhesive.

6. The system of claim 1, further comprising:
a controller that shuts off the laser beam emitter when the temperature sensor senses a sharp increase in temperature.

7. The system of claim 6, further comprising:
a process gas nozzle, wherein the controller controls how process gas is directed towards the contact area.

8. The system of claim 1, further comprising:
a controller adapted to position the suction opening over the electronic component only in the x and y dimensions but not in the z dimension.

9. The system of claim 1, wherein the vacuum suction nozzle is configured so as to allow the electronic component to be sucked into the vacuum suction nozzle when the vacuum suction is generated at the suction opening.

10. A method for removing an electronic component from a circuit board, comprising:
positioning a suction opening of a vacuum suction nozzle over the electronic component, wherein the electronic component has a largest dimension, wherein the electronic component is mounted at a contact area to the circuit board, and wherein the suction opening is dimensioned so as to be larger than the largest dimension of the electronic component;

directing a laser beam through the suction opening and onto the electronic component;

heating the electronic component using the laser beam; and sucking the electronic component into the vacuum suction nozzle using vacuum suction, wherein moving the laser beam over the electronic component only in x and y dimensions but not in a z dimension such that the laser beam is heating only the electronic component that is needed to be removed so as avoiding damaging to a neighboring electronic component, and increasing a speed of removing the electronic component.

11. The method of claim 10, wherein the electronic component is mounted onto the circuit board using solder.

12. The method of claim 10, wherein the electronic component is a light emitting diode.

13. The method of claim 10, further comprising:
measuring a temperature around the contact area; and
turning off the laser beam when the temperature around the contact area exceeds a threshold temperature.

14. The method of claim 13, wherein the temperature is measured based on infrared radiation emitted from around the contact area.

15. The method of claim 13, wherein the temperature is measured based on infrared radiation emitted from around the contact area that travels through the vacuum suction nozzle and is then reflected by a beam splitter towards a temperature sensor.

16. The method of claim 10, further comprising:
measuring a temperature of the electronic component based on infrared radiation emitted from the electronic component.

17. The method of claim 10, further comprising:
directing process gas towards the contact area.

\* \* \* \* \*